(12) United States Patent
Ha et al.

(10) Patent No.: US 7,657,824 B2
(45) Date of Patent: Feb. 2, 2010

(54) METHOD FOR PUNCTURING AN LDPC CHANNEL CODE

(75) Inventors: Jeong-Seok Ha, Atlanta, GA (US);
Steven W. McLaughlin, Decatur, GA (US); Jaehong Kim, Seoul (KR);
Seung-Bum Suh, Seoul (KR)

(73) Assignees: Samsung Electronics Co., Ltd. (KR);
Georgia Tech Research Corporation, Atlanta, GA (US)

( * ) Notice: Subject to any disclaimer, the term of this patent is extended or adjusted under 35 U.S.C. 154(b) by 125 days.

(21) Appl. No.: 11/260,657

(22) Filed: Oct. 27, 2005

(65) Prior Publication Data
US 2006/0156181 A1    Jul. 13, 2006

Related U.S. Application Data

(60) Provisional application No. 60/622,473, filed on Oct. 27, 2004.

(30) Foreign Application Priority Data
May 12, 2005    (KR) .................... 10-2005-0039919

(51) Int. Cl.
*H03M 13/03*    (2006.01)
(52) U.S. Cl. .................... 714/790; 714/752; 714/798
(58) Field of Classification Search ................ 714/790, 714/752, 801, 804, 799, 785, 786, 758
See application file for complete search history.

(56) References Cited

U.S. PATENT DOCUMENTS

| | | | | |
|---|---|---|---|---|
| 6,938,196 | B2* | 8/2005 | Richardson et al. | 714/752 |
| 6,948,109 | B2* | 9/2005 | Coe | 714/752 |
| 7,000,174 | B2* | 2/2006 | Mantha et al. | 714/790 |
| 7,103,819 | B2* | 9/2006 | Kikuchi et al. | 714/752 |
| 7,222,284 | B2* | 5/2007 | Stolpman | 714/774 |
| 2004/0268205 | A1* | 12/2004 | Stolpman | 714/758 |

FOREIGN PATENT DOCUMENTS

EP    1 589 663    10/2005

OTHER PUBLICATIONS

Yazdani et al., On Construction of Rate-Compatible Low-density Parity-Check Codes, IEEE Communications Letters, vol. 8, No. 3. Mar. 2004.

(Continued)

*Primary Examiner*—Scott T Baderman
*Assistant Examiner*—Fritz Alphonse
(74) *Attorney, Agent, or Firm*—NSIP Law

(57) ABSTRACT

A method for puncturing a low density parity check (LDPC) code that is decoded through a parity check matrix expressed by a factor graph including check nodes and bit nodes connected to the check nodes through edges. The method includes classifying the bit nodes mapped to a parity part of a codeword into hierarchical groups according to their decoding facilities when the bit nodes are punctured, determining puncturing order of the groups, and sequentially performing puncturing on the bit nodes from a bit node belonging to a corresponding group according to the puncturing order of the groups to acquire a codeword with a desired coding rate.

8 Claims, 4 Drawing Sheets

OTHER PUBLICATIONS

Jeongseok Ha et al., Optimal Puncturing of Irregular Low-Density Parity-Check Codes, IEEE International Conference on Communications, May 11, 2003.

Jeongseok Ha et al., Optimal Puncturing Distributions for Rate-Compatible Low-Density Parity-Check Codes, IEEE International Symposium on Information Theory, Jun. 29, 2003.

Pishro-Nik et al., Results on Punctured LDPC Codes, IEEE Information Theory Workshop, Oct. 24, 2004.

Li et al., Rate-Compatible Low Density Parity Check Codes for Capacity-Approaching ARQ Schemes in Packet Data Communications, Nov. 18, 2002.

* cited by examiner

○ : BIT NODE

+ : CHECK NODE

METHOD FOR PUNCTURING AN LDPC CHANNEL CODE

PRIORITY

This application claims the benefit under 35 U.S.C. § 119 of an application entitled "Puncturing Methods of Channel Codes" filed in the United States Patent and Trademark Office on Oct. 27, 2004, and assigned Ser. No. 60/622,473, and an application entitled "Method for Puncturing LDPC Channel Code" filed in the Korean Intellectual Property Office on May 12, 2005, and assigned Serial No. 2005-39919, the entire contents of both of which are hereby incorporated by reference.

BACKGROUND OF THE INVENTION

1. Field of the Invention

The present invention relates generally to Low Density Parity Check (LDPC) codes, and in particular, to an LDPC channel code puncturing method for dividing a parity part to be punctured into predetermined groups and assigning different puncturing priorities to the individual groups in order to reduce structural complexity and handle a variation in coding rate while maintaining optimal performance.

2. Description of the Related Art

In general, a digital communication system suffers from errors due to noise, distortion, and interference during data transmission, and commonly uses various algorithms to correct these errors. A $3^{rd}$ generation (3G) wireless communication system uses convolutional codes for transmission of voice and control signals, and turbo codes for efficient transmission of high-speed data. Turbo codes for transmission of high-speed data are advantageous in that they can obtain a very low bit error rate (BER) at a low signal-to-noise ratio (SNR). However, because the turbo code is high in decoding error rate and decoding complexity and cannot employ a parallel structure, it has a limitation on speed improvement. Therefore, an LDPC code, which has superior performance, lower decoding complexity, and higher decoding rate, due to its possible parallel processing as compared with the turbo code, is now attracting public attention as a code for a $4^{th}$ generation (4G) mobile communication system.

Although the LDPC code, which is defined as a parity check matrix, for which most elements are '0', was first proposed by Gallager in 1962, it had not been used due to its low practicality in light of the then-technology. However, in 1995, the LDPC code was rediscovered by MacKay and Neal and it was proved that the LDPC code using a Gallager's simple probabilistic decoding technique is very superior in performance.

The LDPC code is defined as a parity check matrix H in which the number of '1's in each row and column is very small, when compared to the number of '0's. The LDPC code is used to determine if a received signal has been subject to normal decoding. That is, if the product of a coded received signal and the parity check matrix becomes '0', it means that there is no reception error. Therefore, for the LDPC code, a predetermined parity check matrix is first designed such that a product of the parity check matrix and all coded received signals becomes '0', and then a coding matrix for coding a transmission signal is inversely calculated according to the determined parity check matrix.

For decoding using the parity check matrix H of the LDPC code, a probabilistic iterative decoding technique is used, using simple parity check equations, and the probabilistic iterative decoding technique finds a codeword that most probabilistically approximates the codeword in which a product of a received signal vector and the parity check matrix satisfies '0'.

A sum-product algorithm, which is the typical known decoding method for the LDPC code, finds such a codeword by performing soft-decision iterative decoding using a probability value. That is, the sum-product algorithm determines a codeword designed such that a product of a received signal vector and the parity check matrix satisfies '0' by updating a probability value of each bit using characteristics of a received vector and a channel during every iterative decoding.

Another decoding method for the LDPC code is an algorithm for calculating a transmitted message using a log likelihood ratio (LLR). This algorithm is substantially to the same as the sum-product algorithm, except that an LLR value is used instead of the actual probability value for calculating the transmitted message.

FIG. 1 is a diagram illustrating an exemplary parity check matrix of a simple LDPC code, and FIG. 2 is a diagram illustrating an exemplary factor graph for the parity check matrix of FIG. 1. As illustrated in FIG. 2, the parity check matrix can also be expressed with a factor graph including check nodes, variable nodes (also known as "bit nodes") and edges for connecting the check nodes to the bit nodes. The use of the expression of the LDPC code through the factor graph can divide a complicated function into simple partial functions, thereby facilitating implementation of the iterative decoding process. That is, the sum-product algorithm is achieved through a process in which a message value delivered through an edge between nodes connected to each other is iteratively updated with a new value in each of the nodes, and one iteration is achieved when a value in each of the nodes is fully updated.

Because a general wireless communication channel is subject to change in channel state with the passage of time, a channel coding system for correcting errors should be able to flexibly vary a coding rate based on channel state information (CSI).

In order to realize the variation in the coding rate, there has been proposed a method for generating codewords having a higher coding rate by using pairs of encoders and decodes optimally designed for a desired coding rate or puncturing a part of the parity in one mother code with a low coding rate. More specifically, there are two possible algorithms capable of generating LDPC codes with various coding rages. A first algorithm designs a parity check matrix suitable for each of coding rates using parity check matrixes having various coding rates according to a predetermined rule. An LDPC code generated with this algorithm is excellent in performance, and its performance for each coding rate can be estimated. However, this algorithm has difficulty in acquiring various coding rates, and cannot be applied to full incremental redundancy (Full IR) or partial incremental redundancy (Partial IR) in a hybrid automatic repeat request (H-ARQ) system in which combining techniques between coded bits are required due to misalignment of a coded bit stream at each coding rate.

A second algorithm performs puncturing according to a coding rate, after a coding process. In this algorithm, a transmitter performs puncturing according to a predetermined pattern, e.g., random puncturing rule, before transmission, and then a decoder in a receiver enables decoding of a punctured bit node using an error correction function of the LDPC code. Accordingly, the known sum-product algorithm can be used. This puncturing algorithm can simply create a desired coding rate, is not subject to change in coding complexity, and supports rate compatibility, i.e., the same puncturing pattern is used at all coding rates, so it can be applied to the H-ARQ technology. However, an LDPC code generated using this algorithm is often inferior to the LDPC code having an optimal parity check matrix at each coding rate. In addition, the LDPC code generated by this algorithm suffers serious change in performance according to random seed value.

Although various puncturing algorithms are being developed in order to prevent performance deterioration due to the puncturing of the LDPC code, there is room for performance improvement and possible implementation when the channel capacity limit or actual application is taken into consideration.

SUMMARY OF THE INVENTION

It is, therefore, an object of the present invention to provide a method for dividing a parity part subject to puncturing into predetermined groups and determining a puncturing order thereof.

It is another object of the present invention to provide a method for determining a puncturing order of parity groups such that performance of a parity check matrix of an LDPC code can be optimized.

It is further another object of the present invention to provide a method for puncturing parity groups in a puncturing order determined such that performance of a parity check matrix of an LDPC code can be optimized.

It is yet another object of the present invention to provide a puncturing method for improving performance of a parity check matrix of an LDPC code for various coding rates by dividing a parity part to be punctured in a codeword into parity groups with a predetermined pattern, determining puncturing order for the parity groups, and puncturing the parity groups in the puncturing order.

The above and other objects are achieved by providing a method for puncturing a low density parity check (LDPC) code that is decoded through a parity check matrix expressed by a factor graph including check nodes and bit nodes connected to the check nodes through edges. The method includes: classifying the bit nodes mapped to a parity part of a codeword into hierarchical groups according to their decoding facilities when the bit nodes are punctured; determining puncturing order of the groups; and sequentially performing puncturing on the bit nodes from a bit node belonging to a corresponding group according to the puncturing order of the groups to acquire a codeword with a desired coding rate.

Additionally, there is provided a method for puncturing a low density parity check (LDPC) code that is decoded through a parity check matrix expressed by a factor graph including check nodes and bit nodes connected to the check nodes through edges. The method includes the steps of: identifying bit nodes mapped to a parity part of a codeword that can be punctured satisfy a predetermined classification condition in a current decoding step; classifying corresponding bit nodes into bit node groups recoverable with the number of iterations in the current decoding step; classifying message and parity parts of the codeword that should not be punctured into a group with '0' indicating the number of iterations; determining an order of the bit node groups according to the number of their iterations; and creating a parity check matrix in which puncturing order is taken into account by arranging columns of a parity check matrix corresponding to the determined order.

BRIEF DESCRIPTION OF THE DRAWINGS

The above and other objects, features, and advantages of the present invention will become more apparent from the following detailed description when taken in conjunction with the accompanying drawings in which.

DETAILED DESCRIPTION OF EXEMPLARY EMBODIMENT

Figures 1, 2:
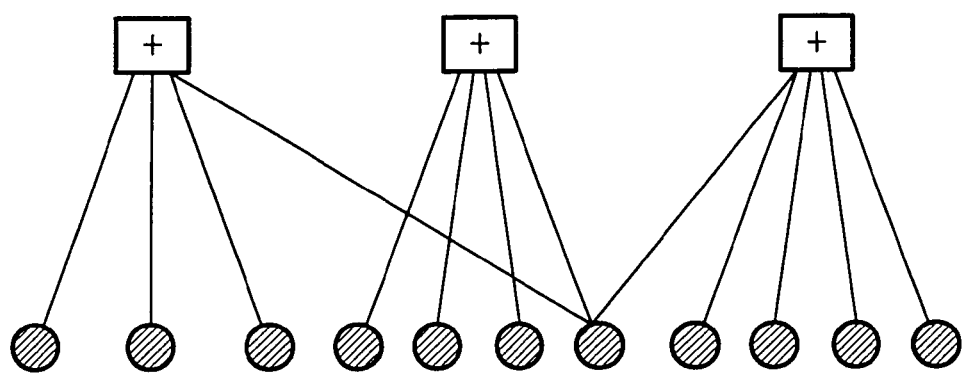
FIG. 1 is a diagram illustrating a parity check matrix of a simple LDPC code.
FIG. 2 is a diagram illustrating an exemplary factor graph for the parity check matrix illustrated FIG. 1.

Preferred embodiments of the present invention will now be described in detail herein below with reference to the annexed drawings. In the drawings, the same or similar elements are denoted by the same reference numerals even though they are depicted in different drawings. Additionally, in the following description, a detailed description of known functions and configurations incorporated herein has been omitted for clarity and conciseness.

Figure 3:
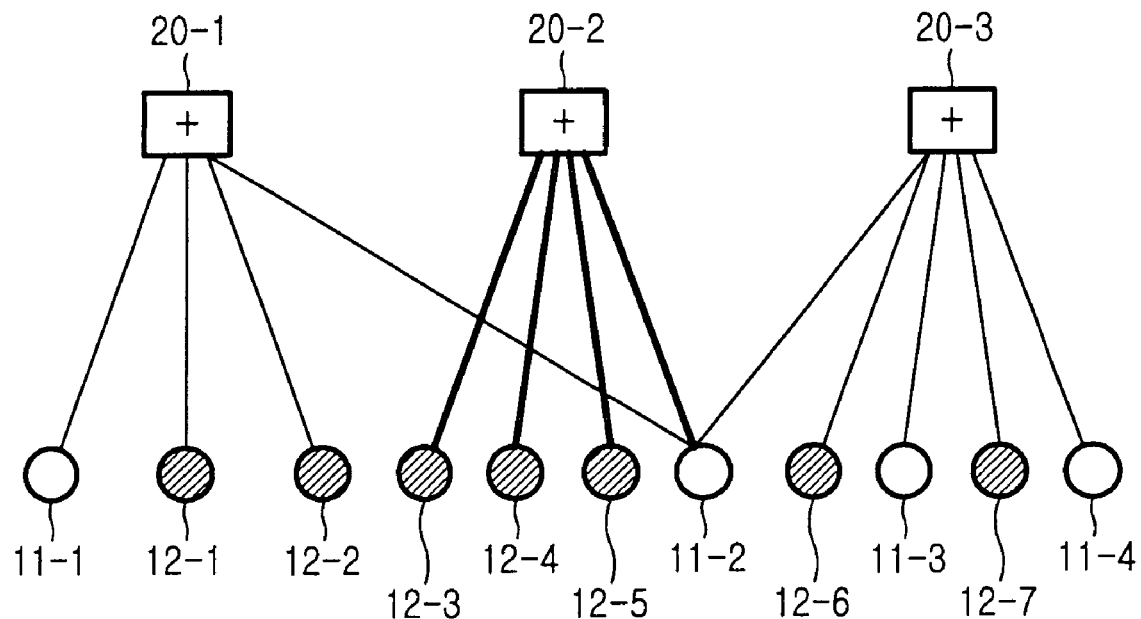
FIG. 3 is a diagram illustrating an exemplary factor graph for a description of terms defined in a puncturing method proposed in the present invention.

FIG. 3 is a diagram illustrating an exemplary factor graph for a description of terms defined in a puncturing method proposed in the present invention. The factor graph is based upon the parity check matrix and the factor graph of the LDPC code illustrated in FIGS. 1 and 2.

Referring to FIG. 3, some of the bit nodes connected to check nodes 20-1 through 20-3 are non-punctured bit nodes 12-1 through 12-7, and the other bit nodes are punctured bit nodes 11-1 through 11-4. Herein, the non-punctured bit nodes 12-1 through 12-7 will be referred to as "0-step recoverable (0-SR) nodes," and for the check node 20-2 connected only to the 0-SR nodes 12-1 through 12-7, except for at least one punctured bit node 11-2 among the check nodes 20-1 through 20-3 connected through the edges, the punctured bit node 11-2 will be referred to as a "1-step recoverable (1-SR) node." The 1-SR node is recoverable through one iterative decoding process during iterative decoding, and can be designated by a designer by randomly determining an initial puncturing pattern or taking into account a coding rate variation region or a characteristic of a mother code.

Therefore, if the step recoverable node is generalized for a definition thereof, a k-SR node becomes a recoverable node through k iterative decoding processes. This will be described mathematically in more detail below.

If the k-SR node is adjacent to (or connected to) one or more check nodes connected to at least one (k−1)-SR node and m-SR nodes (for $0 \leq m \leq k-1$), the punctured bit node can be referred to as a k-step recoverable (k-SR) node. In this case, because puncturable nodes following the initial puncturing pattern are restricted by the foregoing condition, an increase in the value k enables automatic decision on puncturable nodes.

Figure 4:
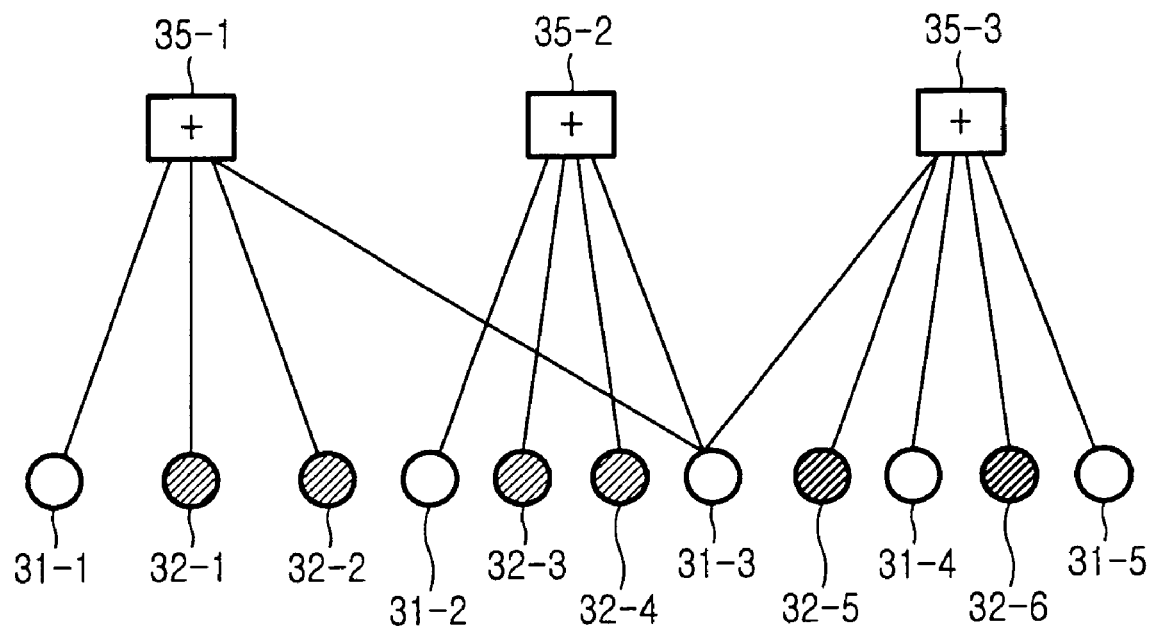
FIG. 4 is a diagram illustrating an exemplary factor graph for a description of generalization of the terms defined in a puncturing method proposed in the present invention.

FIG. 4 is a diagram illustrating an exemplary factor graph for a description of the k-SR node. Describing a punctured bit node 31-3 to be recovered in a $k^{th}$ iterative decoding process during iterative decoding, at least one check node 35-2 among neighboring check nodes 35-1 through 35-3 includes one (k−1)-SR node 31-2 (recovered in a previous $(k−1)^{th}$ iterative decoding process) except for its k-SR node 31-3, and because the other connected bit nodes 32-3 and 32-4 will be the bit nodes (0-SR nodes in this embodiment) recovered in $0^{th}$ through $(k-1)^{th}$ iterative decoding processes, the punctured bit node 31-3 being adjacent to (connected to) the check node 35-2 will be classified as a k-SR node.

Attention should be paid to the k-step recoverable (k-SR) node in that it has a recoverable system with a hierarchical structure from a 1-SR node. For example, a 2-SR node must include a 1-SR node among the bit nodes connected to a check node given to determine a corresponding node as a 2-SR node among neighboring check nodes, and this means that the 1-SR node must be recovered in the previous decoding step in order to recover the 2-SR node. Generalizing this, it can be interpreted that one of the check nodes being adjacent to the k-SR node must include a (k-1)-SR node recovered in the previous decoding step as described above, and the other bit nodes must also be fully decoded in any step of the previous decoding steps or must be a 0-SR node. A summary thereof is the k-SR node's definition described above.

That is, if bit nodes are classified as step recoverable nodes one by one sequentially passing through decoding processes, and thereafter, are grouped according to nodes recoverable in the same step, it is preferable, for performance improvement, to sequentially perform puncturing on from a 1-SR node-group having the highest recovering possibility due to the fewer number of steps needed for decoding. Through the grouping up to this step, it is possible to fully improve puncturing performance desired in the present invention. However, for facilitation of hardware implementation, it is possible to modify a parity check matrix reordered by determining puncturing order through grouping, such that the parity check matrix should have regularity.

Figure 5:
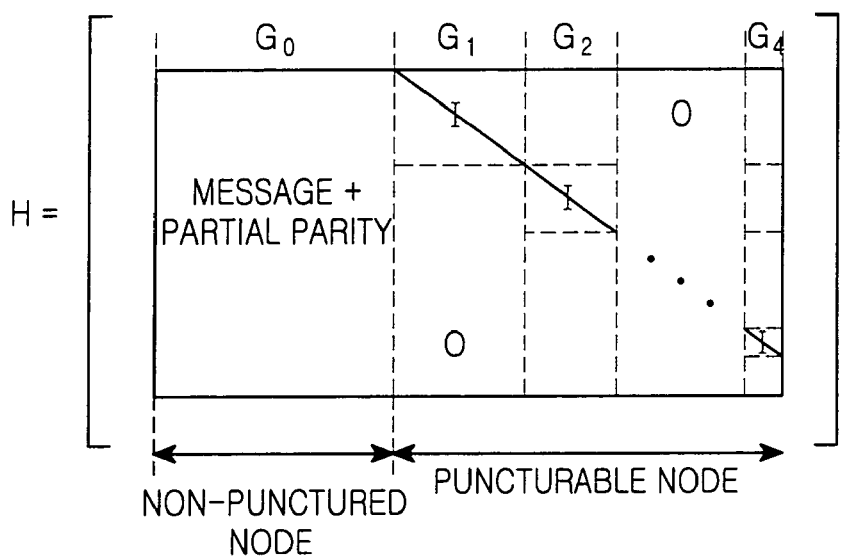
FIG. 5 is a diagram illustrating a parity check matrix of an LDPC code, which is subject to grouping according to an embodiment of the present invention.

FIG. 5 is a diagram illustrating a parity check matrix of an LDPC code, in which the grouped nodes are expressed as columns mapped to their associated nodes in the group order, and thereafter, arranged to have regularity for facilitation of hardware implementation. Herein, 1-SR nodes are classified as $G_1$ and k-SR nodes are classified as $G_k$. Further, columns of the parity check matrix are classified into $G_0$ through $G_k$, and then, subject to column permutation so that the parity check matrix has regularity. This is possible because a characteristic of the parity check matrix is constant even though the parity check matrix undergoes column permutation or row permutation, and it is preferable to design the parity check matrix such that it is simple in parity part, in order to reduce complexity.

To summarize, columns mapped to $G_0$ are columns mapped to the message and parity not to be punctured, and correspond to the bit nodes not to be punctured. Columns mapped to $G_1$ correspond to the bit nodes to be punctured first and the parity belonging thereto can be recovered with one iteration in the iterative decoding when the channel is error-free. In addition, $G_2$ corresponds to the parities to be punctured after all of the parities mapped to the $G_1$ are punctured, $G_3$ corresponds to the parities to be punctured after all of the parities mapped to the $G_1$ and $G_2$ are punctured, and in this manner, $G_k$ corresponds to the parities to be punctured after all of the parities belonging to $G_1, G_2, \ldots, G_{k-1}$ are punctured.

Figure 6:
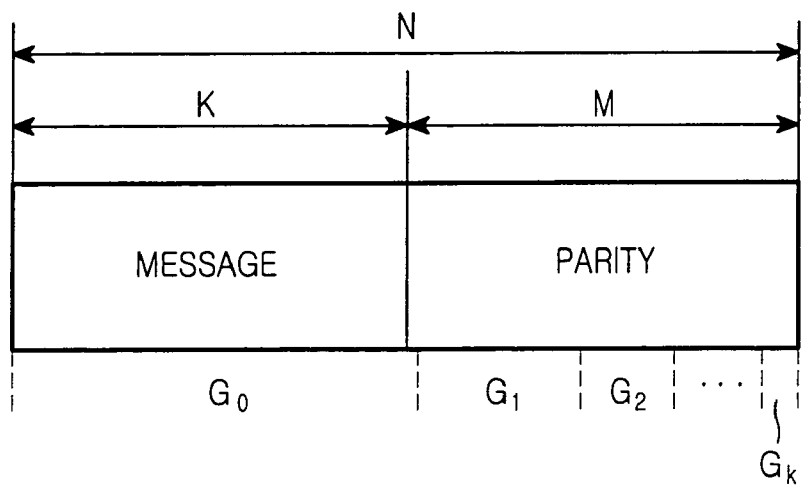
FIG. 6 is a diagram illustrating a puncturing pattern according to an embodiment of the present invention.

FIG. 6 is a diagram illustrating a codeword that is coded through a generator matrix G generated using the parity check matrix H illustrated in FIG. 5, or directly coded through the parity check matrix H. Referring to FIG. 6, a codeword with a length N having a coding rate of the mother code coded by the parity check matrix H described above, corresponds to systematic arrangement of the groups classified according to the present invention. That is, a message with a length K and a part of a parity with a length M are mapped to $G_0$, the other parity parts are sequentially mapped to $G_1, G_2, \ldots, G_k$ according to their puncturing priorities, and a desired coding rate is achieved by puncturing the parity of the mother code. In this case, a puncturing length needed for the desired coding rate is calculated using Equation (1).

$$N_p = \left[ N - \frac{K}{R_p} \right] \quad (1)$$

In Equation (1), N denotes a codeword length of the mother code, K denotes a message length of the mother code, $R_p$ denotes a desired coding rate, and $N_p$ denotes a needed puncturing length.

Therefore, the puncturing length $N_p$ needed at the desired coding rate is calculated, and then, the parities included in $G_1, G_2, \ldots, G_k$ are sequentially punctured by the corresponding length. Accordingly, the desired coding rate can be simply matched to any coding rate being higher than or equal to the coding rate of the mother code, and the same puncturing pattern in the fixed order of $G_1, G_2, \ldots, G_k$ is used at all coding rates, thereby supporting rate compatibility, so it can be applied to the H-ARQ technology.

Although it has been described in the present invention that the 1-SR nodes can be recovered through 1-step iterative decoding, this is for the case where there is no error in a channel. However, it should be noted that in an additive white Gaussian noise (AWGN) channel or actual channel environment, even the 1-SR nodes can be hard to be recovered through the 1-step iterative decoding.

As can be understood from the foregoing description, the novel LDPC channel code puncturing method classifies parities included in the mother code into parity groups according to their puncturing priorities, arranges the parity groups in the puncturing order, and performs puncturing on the groups in order, thereby achieving a desiring coding rate. Accordingly, the puncturing method minimizes a loss due to the puncturing, thereby showing better performance than that of the random puncturing algorithm.

In addition, with the use of a single encoder-decoder pair, the proposed code can show performance approximating that of the dedicated code that requires a plurality of encoder-decoder pairs, thereby contributing to a decrease in implementation complexity.

In addition, the puncturing method can perform grouping on the parities to be punctured through a simple definition and an algorithm based thereon, and cope with a variation in coding rate through puncturing length adjustment for a desired coding rate, thereby offering high design and application conveniences as compared with the dedicated code that has high design complexity and has a limitation on possible coding rates.

Further, because the proposed code uses the same puncturing order for all coding rates, it can be applied to the H-ARQ technology combined of retransmission and error correction functions, thereby contributing to an increase in error control performance as compared with the dedicated code that can be hardly applied to the H-ARQ technology.

While the present invention has been shown and described with reference to certain preferred embodiments thereof, it will be understood by those skilled in the art that various changes in form and details may be made therein without departing from the spirit and scope of the present invention as defined by the appended claims.

What is claimed is:

1. A method for puncturing a low density parity check (LDPC) code that is decoded through a parity check matrix expressed by a factor graph including check nodes and bit nodes connected to the check nodes through edges, the method comprising the steps of:
   classifying the bit nodes mapped to a parity part of a codeword into hierarchical groups according to their decoding facilities when the bit nodes are punctured;
   determining a puncturing order of the hierarchical groups based on the decoding facilities; and
   acquiring a codeword with a desired coding rate by sequentially puncturing the bit nodes belonging to a corresponding group according to the determined puncturing order of the hierarchical groups.

2. The method of claim 1, wherein a decoding facility of a bit node is determined based on the number of required iterations to recover the punctured bit node when the channel is error-free, and as the number of iterations decreases, the corresponding bit node is classified into a hierarchical group having a higher puncturing priority.

3. The method of claim 1, wherein if there is a check node connected only to bit nodes not to be punctured, except for its bit node to be punctured, among check nodes connected to the bit node to be punctured, the bit node to be punctured is classified into a group having the highest puncturing priority.

4. The method of claim 1, wherein if there is a check node connected only to bit nodes that are one of bit nodes recoverable during a previous iterative decoding process or bit nodes not to be punctured, except for its bit node to be punctured among check nodes connected to the bit node to be punctured, the number of required iterations for recovery in the iterative decoding process when the channel is error-free is used as criteria for classifying the bit node to be punctured into the corresponding group.

5. The method of claim 4, wherein at least one of the bit nodes connected to the check node is a bit node recoverable from the immediately previous iteration in the iterative decoding process.

6. A method for puncturing a low density parity check (LDPC) code that is decoded through a parity check matrix expressed by a factor graph including check nodes and bit nodes connected to the check nodes through edges, the method comprising the steps of:
   identifying bit nodes mapped to a parity part of a codeword that can be punctured satisfying a predetermined classification condition in a current decoding step;
   classifying corresponding bit nodes into bit node groups recoverable with the number of iterations in the current decoding step;
   classifying message and parity parts of the codeword that should not to be punctured into a group with '0' indicating the number of required iterations for recovery when the channel is error-free;
   determining a puncturing order of the bit node groups according to the number of their required iterations for recovery in an iterative decoding process when the channel is error-free; and
   creating a parity check matrix in which puncturing order is taken into account by arranging columns of a parity check matrix corresponding to the determined puncturing order.

7. The method of claim 6, wherein if at least one of check nodes connected to a particular punctured bit node is connected to at least one bit node recoverable from the immediately previous iteration in the iterative decoding process when the channel is error-free, except for its associated bit node, and only to bit nodes recoverable from any previous iteration in the iterative decoding process, it is determined that the particular node satisfies the predetermined classification condition.

8. The method of claim 6, further comprising the step of performing column permutation such that a part of puncturable groups in a parity part of the parity check matrix in which the puncturing order is taken into account forms an identity matrix.

* * * * *